United States Patent [19]
Yamana

[11] Patent Number: 5,965,310
[45] Date of Patent: Oct. 12, 1999

[54] PROCESS OF PATTERNING PHOTO RESIST LAYER EXTENDING OVER STEP OF UNDERLYING LAYER WITHOUT DEFORMATION OF PATTERN

[75] Inventor: Mitsuharu Yamana, Tokyo, Japan

[73] Assignee: NEC Corporation, Tokyo, Japan

[21] Appl. No.: 09/041,656

[22] Filed: Mar. 13, 1998

[30] Foreign Application Priority Data

Mar. 14, 1997 [JP] Japan ................................ 9-082051

[51] Int. Cl.$^6$ ........................................................ G03F 7/00
[52] U.S. Cl. ........................... 430/30; 430/311; 430/325
[58] Field of Search ............................ 430/30, 311, 325, 430/396

[56] References Cited

U.S. PATENT DOCUMENTS 5,858,590   1/1999   Kwon et al. ............................... 430/30

FOREIGN PATENT DOCUMENTS

| | | |
|---|---|---|
| 1-253955 | 10/1989 | Japan . |
| 2-7515 | 1/1990 | Japan . |
| 3-211858 | 9/1991 | Japan . |
| 8-022947 | 1/1996 | Japan . |

OTHER PUBLICATIONS

Abstract of JP 9–129534, "Forming Method of Resist Pattern", Takeuchi, May 1997.

*Primary Examiner*—John A. McPherson
*Attorney, Agent, or Firm*—Foley & Lardner

[57] ABSTRACT

When an underlying layer with a step is covered with a photo resist layer, the photo resist layer has a thick portion and a thin portion, and the difference in thickness causes a pattern extending over the step to be deformed due to influences of a standing wave; in order to prevent a pattern of a photo resist layer extending over an underlying layer with a step, the photo resist layer is regulated in such a manner that a difference between a target thickness of the thick portion and a certain thickness at an extreme value of a critical dimension on a characteristic curve is approximately equal to a difference between a target thickness of the thin portion and the certain thickness, then the influence of the standing wave becomes equivalent between the thick portion and the thin portion, and the pattern is prevented from the deformations.

7 Claims, 10 Drawing Sheets

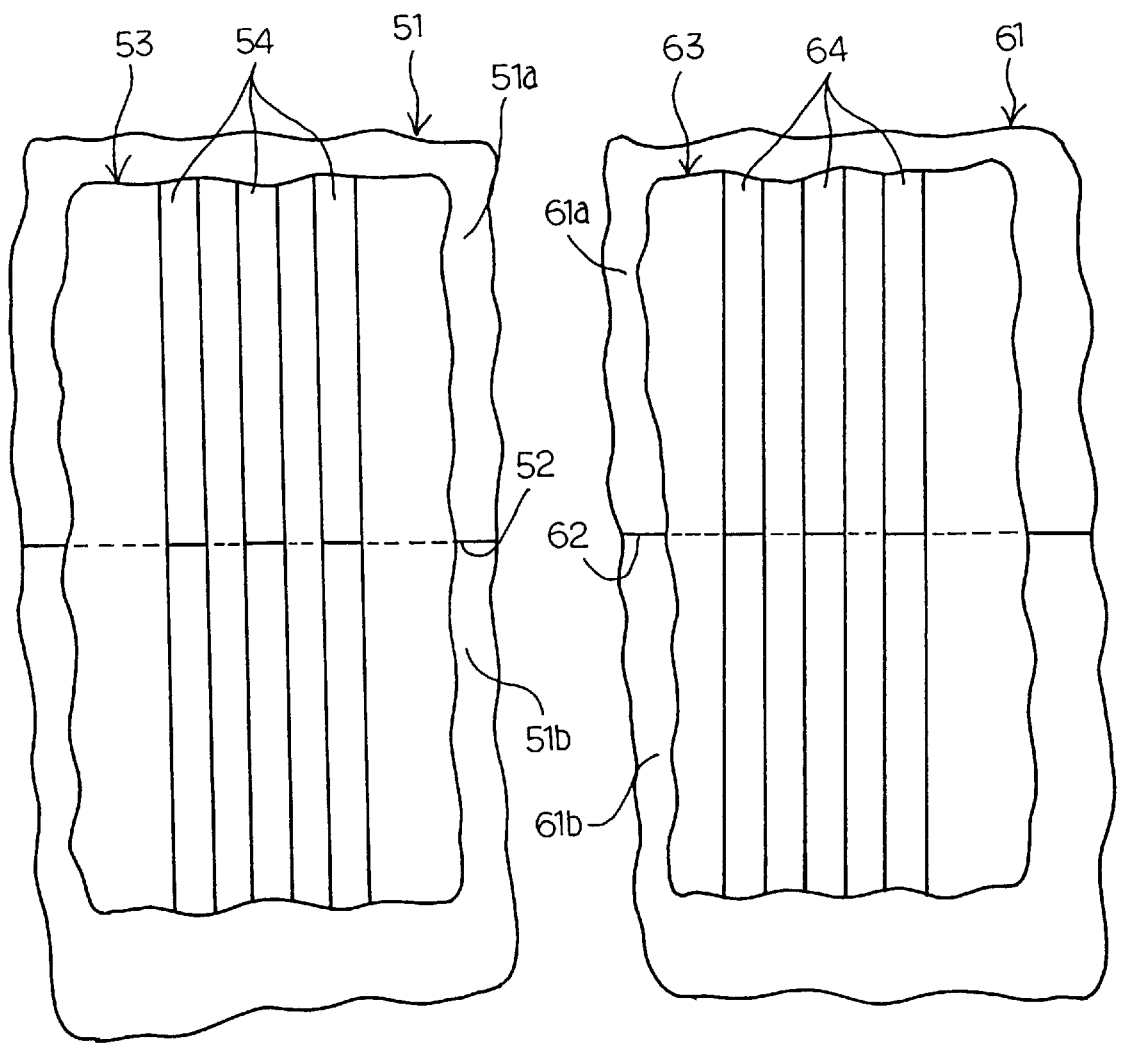

PROCESS OF PATTERNING PHOTO RESIST LAYER EXTENDING OVER STEP OF UNDERLYING LAYER WITHOUT DEFORMATION OF PATTERN

FIELD OF THE INVENTION

This invention relates to a photo-lithographic technology and, more particularly, to a process of patterning a photo-resist layer extending over a step of an underlying layer.

DESCRIPTION OF THE RELATED ART

The photo-lithography is an important technology for a fabrication of a semiconductor device. The photo-lithography is broken down into a photo-resist coating, optical pattern transfer to the photo-resist layer and a development of the latent image. When a pattern image is transferred from a photo mask to a photo resist layer, g-ray of 436 nanometer wavelength, i-ray of 365 nanometer wavelength or KrF excimer layer light of 248 nanometer wavelength is radiated from a light source through the photo-mask to the photo resist layer, and standing wave takes place in the photo resist due to the reflection on the substrate under the photo resist. For this reason, the soluble portion of photo resist is periodically varied depending upon the thickness of the photo resist due to the standing wave. When the latent image is developed, the soluble portion is removed, and the photo resist pattern is formed from the photo resist layer. As described hereinbefore, the standing wave varies the width of the soluble resist in dependence on the thickness of the photo resist layer, and the photo resist pattern is also varied with the thickness of the photo resist layer. In an actual patter transfer, the thickness of the photo resist layer is adjusted to a certain value where the pattern width takes the extreme value.

If the underlying layer has a flat surface, the manufacturer can exactly form a photo resist pattern through the above described pattern transfer technology. However, the underlying layer is not always flat. The underlying layer usually has steps, and the upper surface partially projects from another portion. When photo resist solution is spun onto the underlying layer, the step causes the photo resist layer to have a thick portion and a thin portion. In this situation, even if a certain portion of the photo resist layer is adjusted to a target thickness, a remaining portion is inappropriate, and the resist pattern is deformed between the certain portion and the remaining portion.

FIG. 1 shows an underlying layer 1, and a step 1c divides the underlying layer 1 into an upper portion 1b and a lower portion 1c. When photo resist solution is spun onto the underlying layer 1, the spin-coating creates a flat upper surface of the photo resist layer, and the photo resist layer has a thin portion 2a over the upper portion 1b and a thick portion 2b over the lower portion 1c. If a straight slit pattern is transferred from a photo mask to the photo resist layer 2, the influence of standing wave is different between the thin portion 2a and the thick portion 2b, and the standing wave makes the exposure different between the thin portion 2a and the thick portion 2b. The soluble resist becomes wide in the thin portion 2a and narrow in the thick portion 2b. When the photo resist layer 2 is treated with developing solution, the developing solution removes the soluble resist, and forms the straight slits 3 different in width between the thin portion 2a and the thick portion 2b. Thus, the standing wave deforms the straight slits 3, and the deformed slit pattern is transferred to the underlying layer 1 through an etching.

Several pattern transfer technologies have been proposed for a photo resist layer with a step. One of the prior art technologies is disclosed in Japanese Patent Publication of Unexamined Application No. 2-7515. According to the first prior art technology, the exposure time enough to make the resist soluble is varied with the rotation of a spin coater as indicated by plots PL1 and PL2. Plots PL1 represents the photo resist over an upper portion of a step, and plots PL2 stand for the photo resist over a lower portion of the step. The thickness of the photo resist layer is proportional to the revolution of the spin coater. Plots PL1 is parallel to plots PL2 between point "A" and point "B", and the spin coater is adjusted to a certain revolution between point "A" and point "B". Then, the photo resist layer has the similar photo-affected characteristics between the thin portion and the thick portion.

After the pattern transfer to the photo resist layer spread over a semiconductor wafer, the latent image is developed. While the latent image is being developed, light is radiated through the photo-resist layer to the semiconductor layer, and monitors the reflection in order to detect an end point of the development. FIG. 3 shows variation of the reflection under the influence of the standing wave. While developing solution is removing the soluble resist from a photo resist layer, the reflection is periodically varied due to the variation of the thickness, and passes the minimum value at times A, B and C. The underlying layer is exposed at time D, and the reflection becomes constant. The Japanese Patent Publication of Unexamined Application proposes to determine the end point of the development on the basis of the last minimum value at time C.

The prior art technology disclosed in Japanese Patent Publication of Unexamined Application No. 2-7515 encounters a problem in that the resist pattern is still deformed. Although the prior art technology is effective against the fluctuation of the thickness of the photo resist, the light intensity is difference between the thin portion and the thick portion due to the difference in thickness, and the different light intensity makes the soluble resist portion difference in width between the thin portion and the thick portion.

Another prior art technology is disclosed in Japanese Patent Publication of Unexamined Application No. 1-253955. According to the second prior art technology, a step between an n-well and a p-well is adjusted to a multiple of $(\lambda/2n)$ where $\lambda$ is the wavelength of exposure light and $n$ is the refractive index of resist. When photo resist solution is spread over the n-well and the p-well, the photo resist layer has a step over the boundary between the n-well and the p-well. However, the step is a multiple of $(\lambda/2n)$, and the standing wave varies the resist pattern at a period of $(\lambda/2n)$. For this reason, even if a resist patter extends over the step, the resist pattern is less deformed.

The third prior art technology is disclosed in Japanese Patent Publication of Unexamined Application No. 3-211858. According to the third prior art method, a step between an isolating region and active regions is also adjusted to a multiple of $(\lambda/2n)$. The step adjusted to the multiple of $(\lambda/2n)$ also prevents a resist pattern from deformation due to the standing wave as similar to the second prior art method. However, the desirable effect is obtained at the step adjusted to a multiple of $(\lambda/2n)$, only. A semiconductor device usually has various steps, and it is impossible to adjust all the steps to multiples of $(\lambda/2n)$. Thus, the problem inherent in the second and third technologies is lack of universality.

The fourth prior art technology is an anti-reflective coating layer inserted between an underlying layer and a photo resist layer. The standing wave is produced through the reflection of exposure light, and the anti-reflective coating layer restricts the standing wave. For this reason, the anti-reflective coating layer prevents the resist pattern from deformation. However, the anti-reflective coating layer is causative of defects in the photo resist layer. The defects cause the underlying layer to be not uniformly etched, and, for this reason, the anti-reflective coating layer is less suitable to formation of a miniature pattern.

SUMMARY OF THE INVENTION

It is therefore an important object of the present invention to provide a process for patterning a photo resist layer which is suitable for a miniature pattern transfer and prevents the photo resist pattern from undesirable deformation due to standing wave regardless of the distance between an upper portion and a lower portion of an underlying layer.

In accordance with one aspect of the present invention, there is provided a process of patterning a photo resist layer, which comprises the steps of a) preparing an underlying layer having an upper portion and a lower portion on both sides of a step and a characteristic curve representative of relation between a critical dimension of a pattern formed in a sample photo resist layer and a thickness of the sample photo resist layer to be required for the critical dimension, b) determining a first target thickness of a thick portion of a photo resist layer extending over the lower portion and a second target thickness of a thin portion of the photo resist layer extending over the upper portion in such a manner that a difference between the first target thickness and a certain thickness at an extreme value of the critical dimension on the characteristic curve is approximately equal to a difference between the second target thickness and the certain thickness, c) covering the underlying layer with the photo resist layer having the thin portion and the thick portion and d) forming the photo resist layer into a photo resist pattern having the critical dimension.

BRIEF DESCRIPTION OF THE DRAWINGS

The features and advantages of the method will be more clearly understood from the following description taken in conjunction with the accompanying drawings in which:

FIGS. 8A to 8D are plane views showing photo resist patterns formed through the method according to the present invention.

DESCRIPTION OF THE PREFERRED EMBODIMENT

Principle of Pattern Transfer

Figure 1:
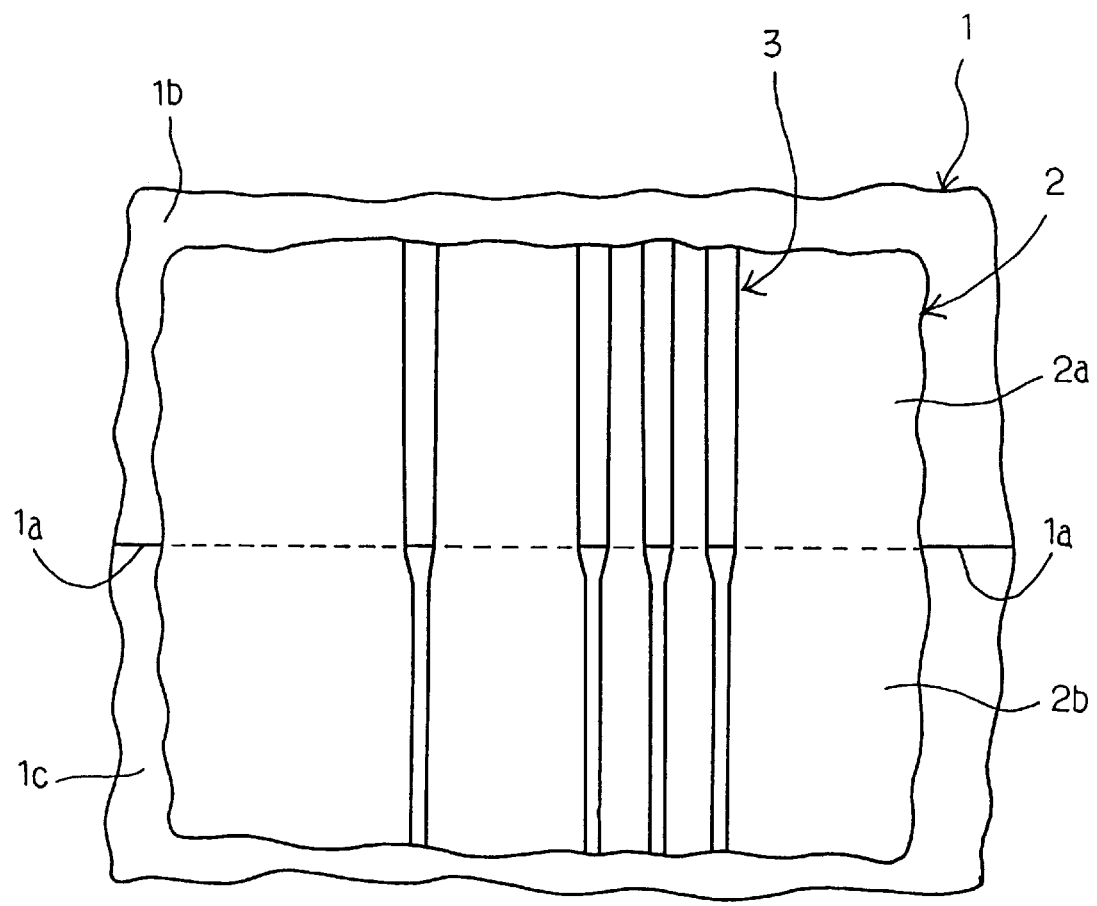
FIG. 1 is a plane view showing the photo resist mask formed over the step through the prior art pattern transfer method.
Figure 2:
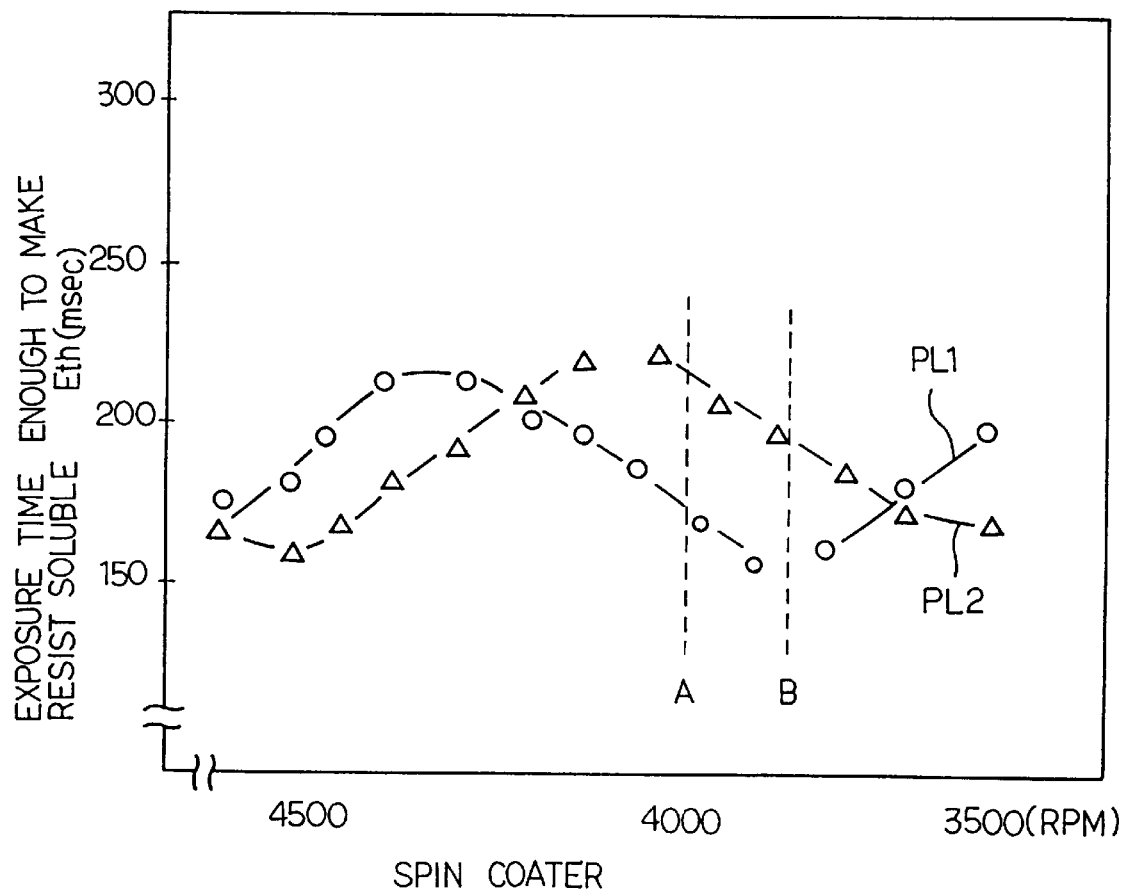
FIG. 2 is a graph showing the relation between the exposure time enough to make the resist soluble and the revolution of the spin coater.
Figure 3:
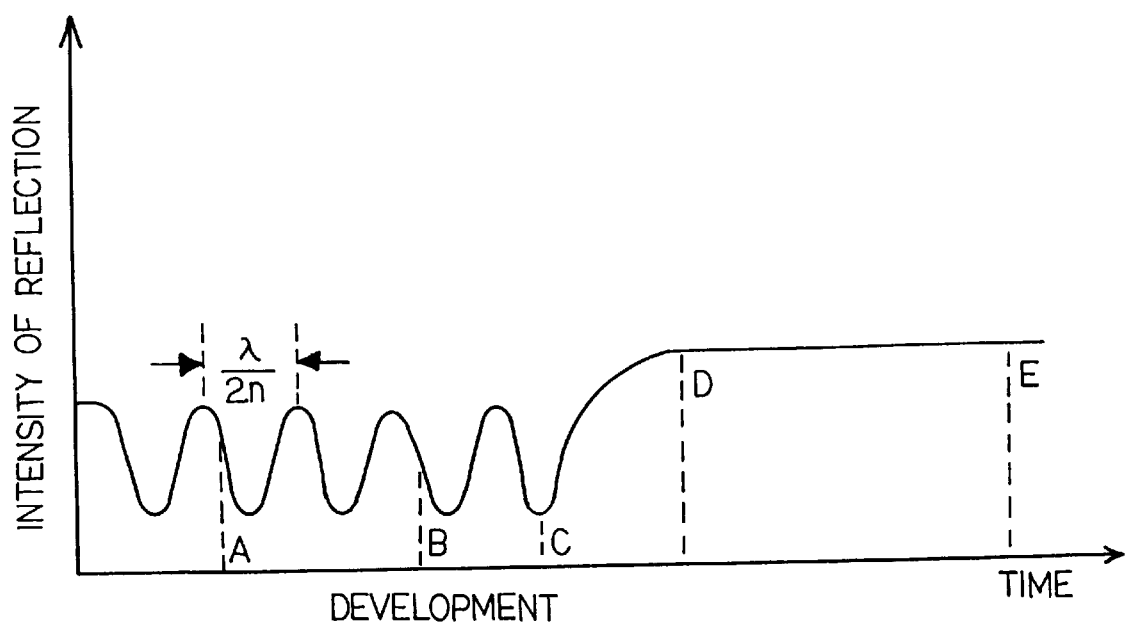
FIG. 3 is a graph showing the relation between the intensity of reflection and the developing time.
Figure 4:
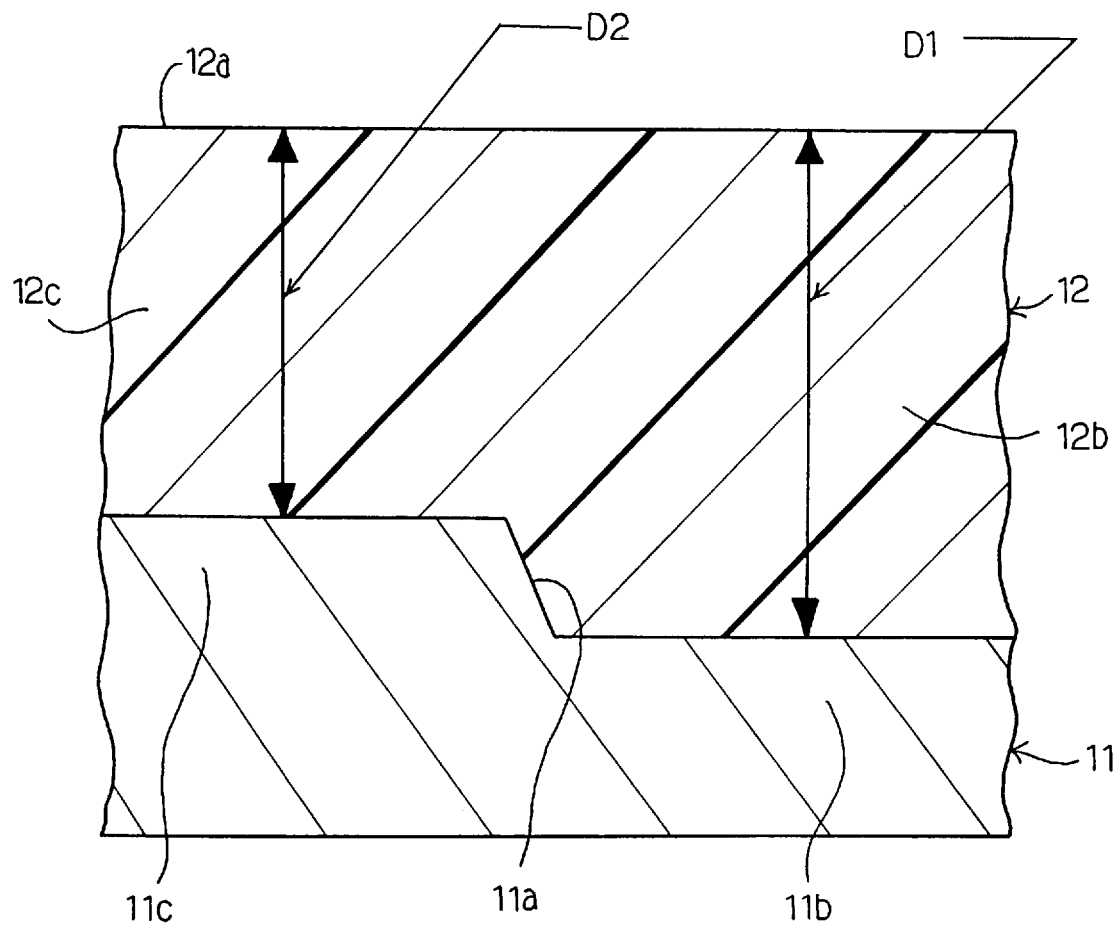
FIG. 4 is a cross sectional view showing a photo resist layer spread over a semiconductor structure.

FIG. 4 illustrates a photo resist layer 11 spread over an underlying layer 12 by using a spin coater (not shown). The underlying layer 12 may be a semiconductor layer, a conductive layer or an insulating layer formed over a semiconductor wafer. The underlying layer 11 has a step 11a, and the step 11a divides the underlying layer 11 into a lower portion 11b and an upper portion 11c. A flat surface 12a is created through the spin coating, and the photo resist layer 12 is divided into a thick portion 12b over the lower portion 11b and a thin portion 12c over the upper portion 11c. D1 and D2 are representative of a thickness between the upper surface 12a and the boundary between the lower portion 11b and the thick portion 12b and a thickness between the upper surface 12a and the boundary between the upper portion 11c and the upper portion 12c, respectively.

When the photo resist solution is spread over the underlying layer 11, the revolution of the spin coater is regulated in such a manner that the difference between the thickness D1 and a thickness t at an extreme value on a characteristic curve is equal to the difference between the thickness D2 and the thickness t before exposure to image carrying light.

Figure 5:
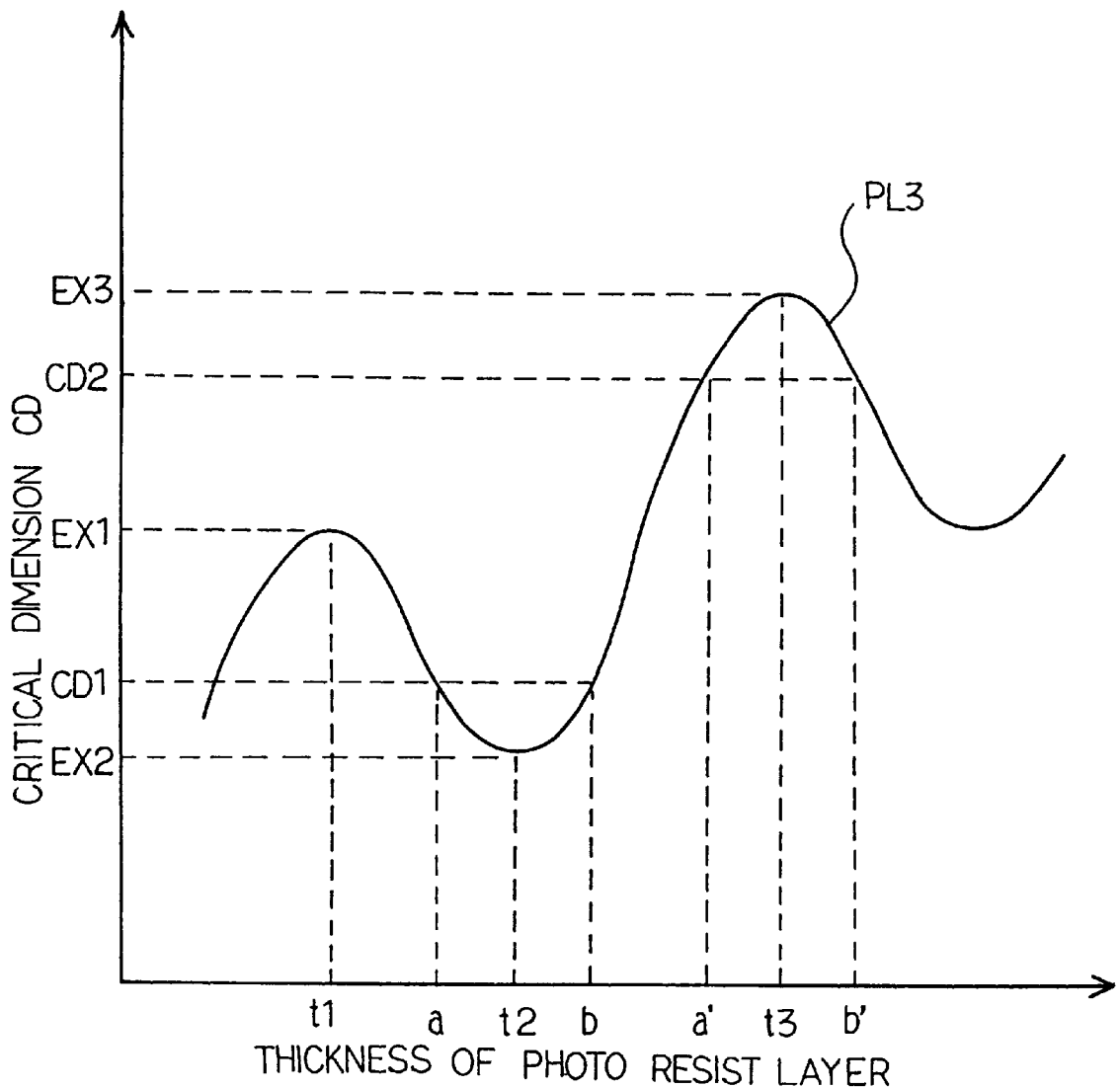
FIG. 5 is a graph showing relation between the thickness of a photo resist layer and a critical dimension of a pattern to be transferred to the photo-resist layer.

In detail, FIG. 5 illustrates the characteristic curve PL3 representative of relation between a critical dimension CD and the thickness of a photo resist layer. The critical dimension is the width of a line or the width of a space to be formed in the photo resist layer. In order to form a certain critical dimension, the photo resist layer is required to have the corresponding thickness on the characteristic curve. For example, if the critical dimension is CD2, the photo resist layer should be either a' or b' in thickness. The characteristic curve is waved as indicated by plots PL3, and has extreme values EX1, EX2 and EX3. In this instance, if the photo resist layer has the thickness t1, t2 and t3, the critical dimension CD has the extreme values EX1, EX2 and EX3.

As described hereinbefore, the difference between the thickness D1 and a thickness t at an extreme value on a characteristic curve is equal to the difference between the thickness D2 and the thickness t. For example, if the thicknesses D1 and D2 are b and a, equation $|b-t2|=|t2-a|$ is satisfied by the photo resist layer 12.

Lithographic Process

Using the principle of pattern transfer according to the present invention, a pattern transfer process is carried out as follows. FIGS. 6A to 6E illustrate a pattern transfer process embodying the present invention. The process starts with preparation of a semiconductor structure 20 (see FIG. 6C) and a characteristic curve PL4 representative of relation between a critical dimension of a pattern formed in a photo resist layer and a thickness of the photo resist layer to be required for the critical dimension. The semiconductor structure 20 comprises a semiconductor wafer 20a, a lower pattern 20b, an insulating layer 20c and an upper conductive layer 20d. The upper conductive layer 20d serves as an underlying layer. The upper conductive layer 20d has steps, and the steps are assumed to have height equal to Dx. The upper conductive layer 20d has a lower portion and an upper portion on both sides of each step.

Assuming now that the critical dimension is CRx (see FIG. 6D), the manufacturer 21 checks the characteristic curve PL4 to see what extreme value makes the difference of adjacent points at the critical dimension CRx equal to the height Dx. In this way, a first target thickness t1 over the lower portion and a second target thickness t2 over the upper portion are determined for a photo resist layer (see FIG. 6A).

Figure 6A:
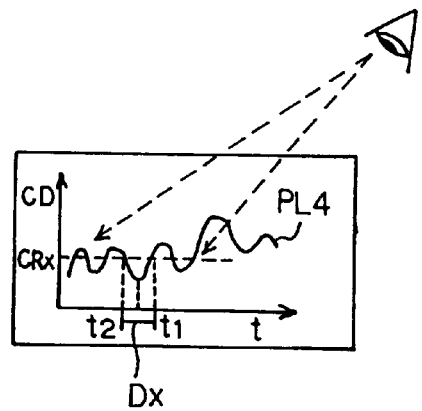
FIGS. 6A to 6E are views showing a process of patterning a photo resist layer according to the present invention.
Figure 6B:
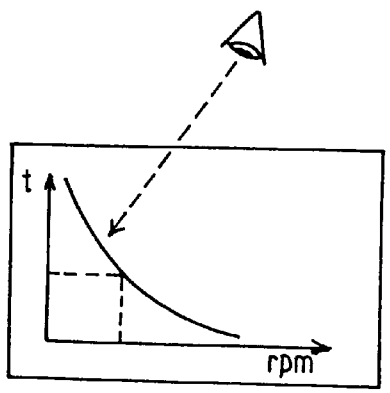
Figure 6C:
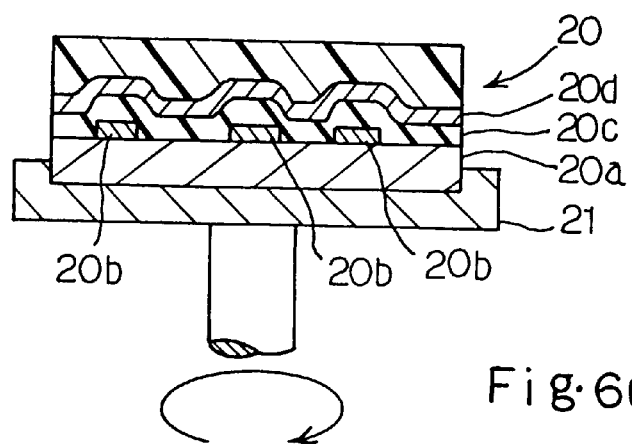

Subsequently, the manufacturer determines a target revolution of a spin coater 21 (see FIG. 6B), and photo-resist solution is spun onto the upper conductive layer 20d at the target revolution. Then, the upper conductive layer 20d is covered with the photo resist solution as shown in FIG. 6C. The photo resist is baked so as to form a photo resist layer 22, and the photo resist layer 22 is regulated to the target thicknesses t1 and t2.

Figure 6D:
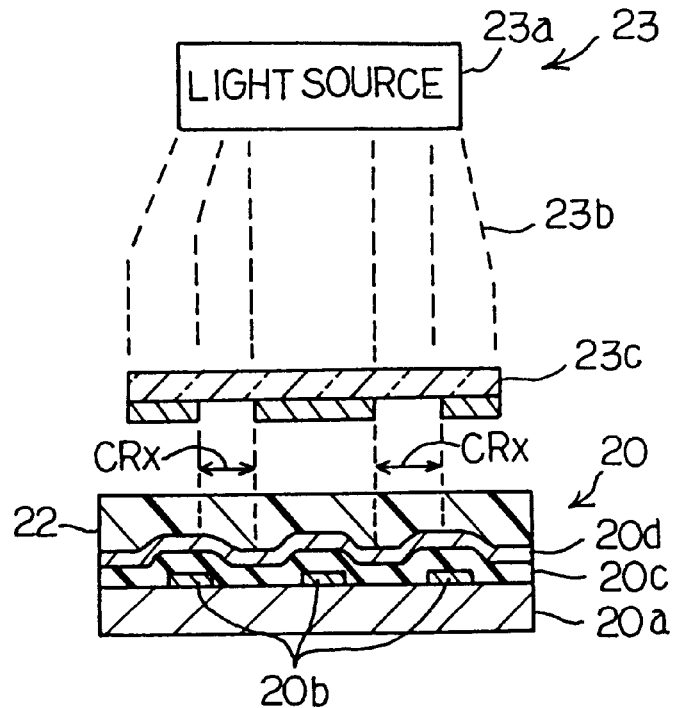

The resultant semiconductor structure is placed in an aligner 23, and a light source 23a radiates light 23b through a photo mask 23c to the photo resist layer 22. The light source may radiate g-ray, i-ray, KrF excimer laser light or ArF excimer laser light. The light 23b carries a pattern formed on the photo mask 23c onto the photo resist layer 22, and forms a latent image of soluble resist therein as shown in FIG. 6D. The light 23b is reflected on the upper conductive layer 20d, and standing wave takes place. However, the influence of standing wave is equivalent between the thick portion and the thin portion of the photo resist layer 22, and the latent image is not deformed between the thick portion and the thin portion.

Figure 6E:
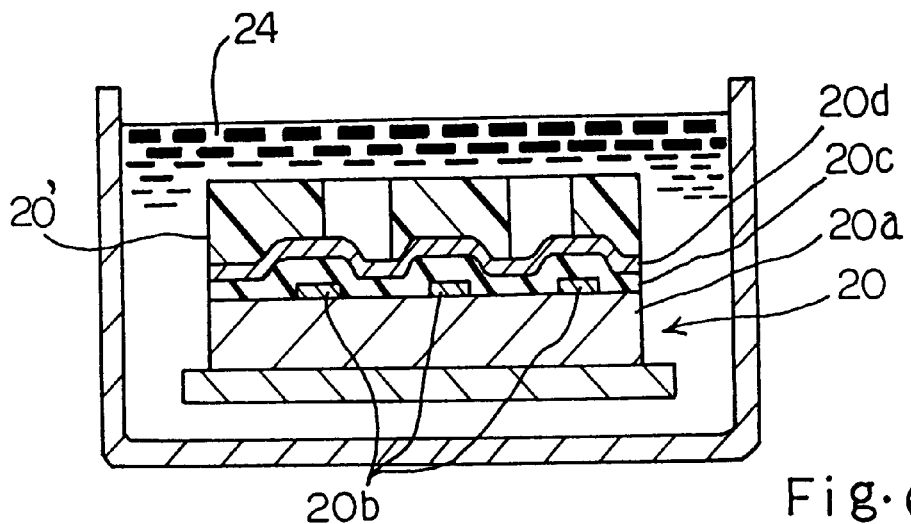

The resultant semiconductor structure is dipped in developing solution 24, and the latent image is developed. The photo resist layer 20 is rinsed, and the photo resist layer is formed into a photo resist pattern 20' as shown in FIG. 6E.

As will be appreciated from the foregoing description, the manufacturer selects a pair of target thicknesses appropriate for the height of the step, and the photo resist is optimized regardless of the wavelength of exposure light 23b. Moreover, any anti-reflective coating layer is never inserted between the underlying layer and the photo resist layer, and the process of patterning a photo resist layer according to the present invention is available for forming a miniature pattern.

Figure 7:
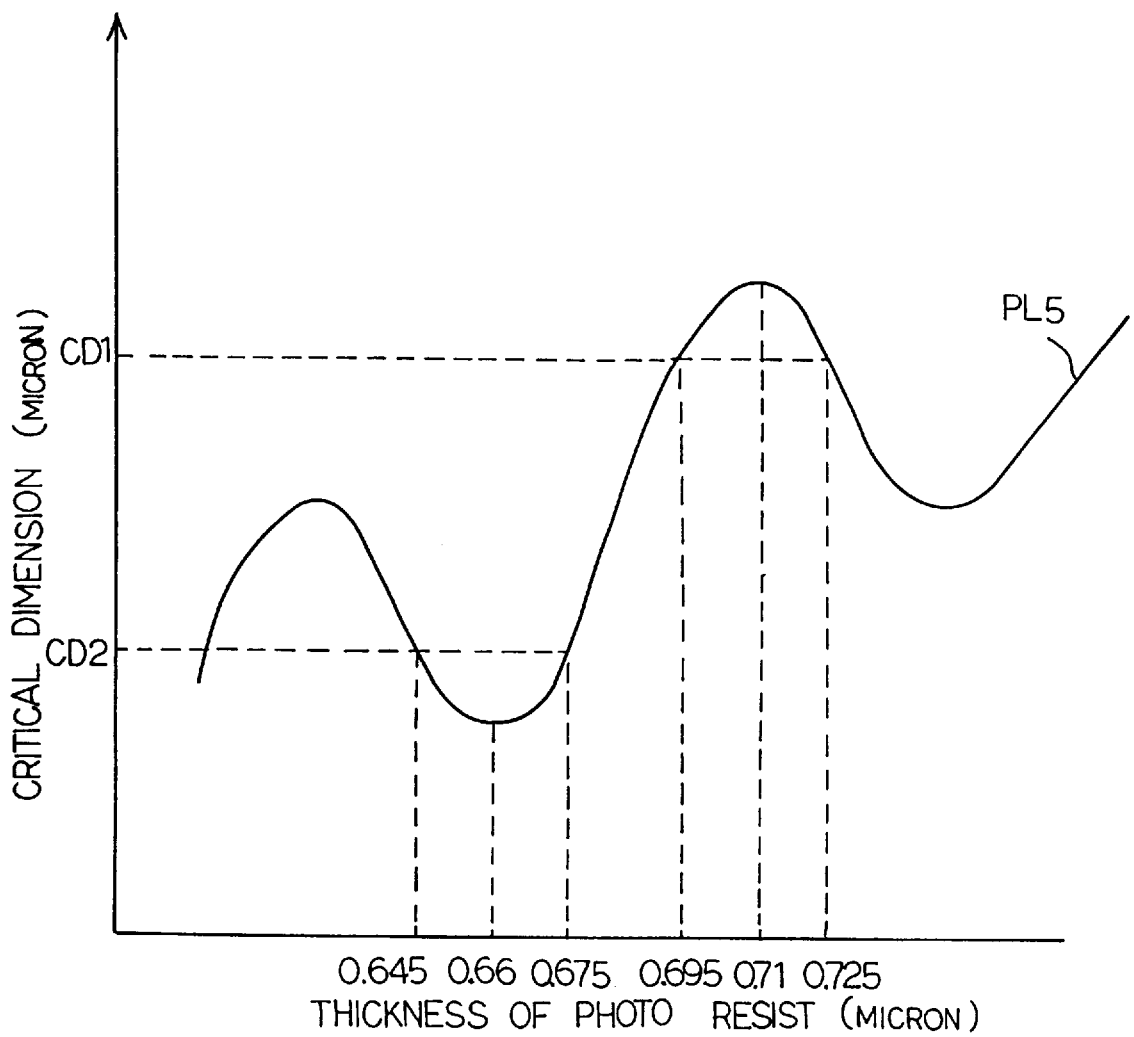
FIG. 7 is a graph showing an example of the relation between the thickness of a photo resist layer and the critical dimension.

Using an example of the characteristic curve PL5 shown in FIG. 7, the present inventor investigated the process of patterning a photo resist layer according to the present invention as follows.

EXAMPLE 1

An underlying layer 31 had a step 32 between an upper portion 31a and a lower portion 31b, and the distance between the upper portion 31a and the lower portion 31b, i.e., the height of the step 32 was 0.03 micron. A pattern to be transferred was an isolated stripe, and the critical dimension was CD1.

Photo resist solution was spun onto the underlying layer 31, and was baked so as to form a photo resist layer 33. The revolution of the spin coater was regulated in such a manner that the photo resist layer 33 was 0.695 micron thick over the upper portion 31a and 0.725 micron thick over the lower portion 31b in accordance with the characteristic curve PL5.

Figures 8A, 8B:
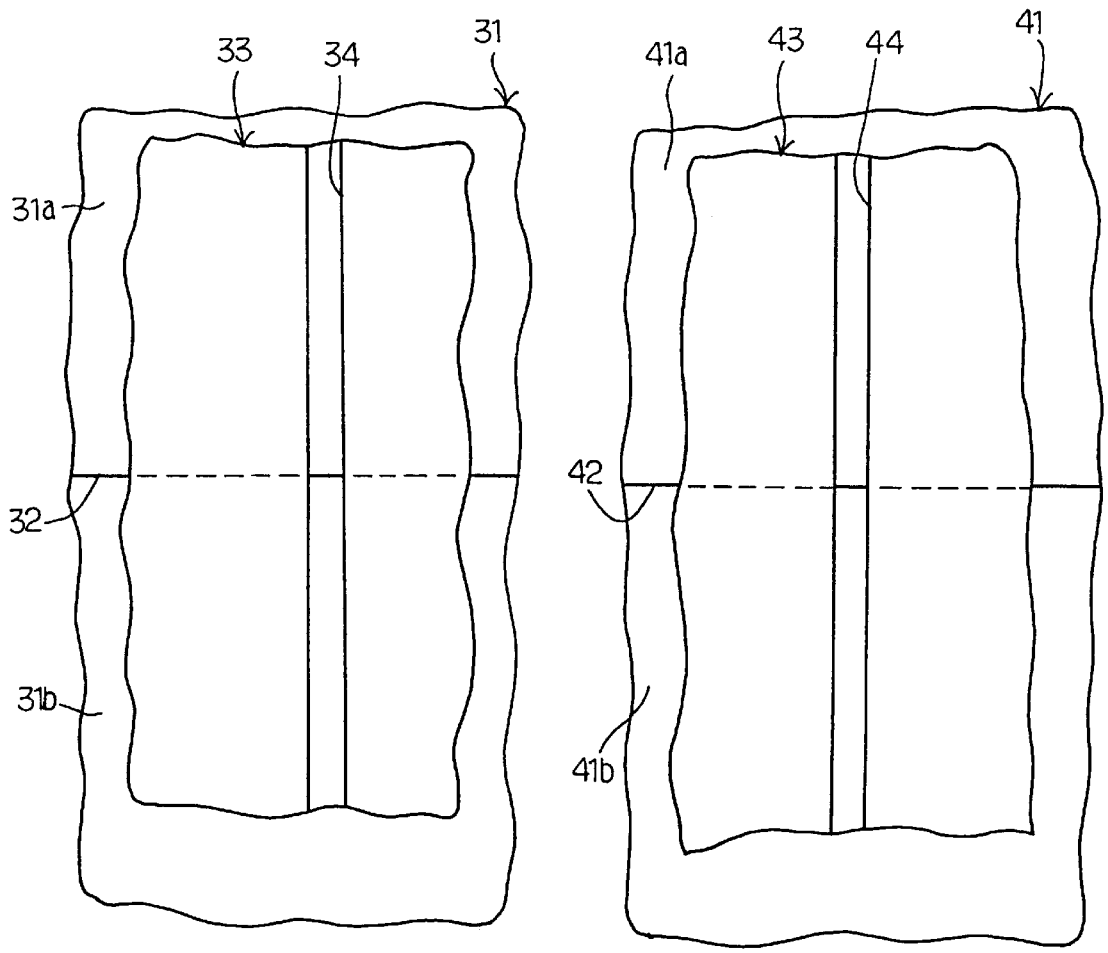

The resultant structure was placed in a KrF excimer laser stepper, and the isolated pattern was transferred through KrF excimer laser light to the photo resist layer 33. The photo resist layer 33 was baked, again. The latent image was developed by using 2.38% solution of tetramethylammoniumhydroxide for 60 seconds. After the rinse, the isolated pattern 34 was formed in the photo resist layer 33 as shown in FIG. 8A. Any serious deformation did not take place on both sides of the step 32.

EXAMPLE 2

An underlying layer 41 had a step 42 between an upper portion 41a and a lower portion 41b, and the distance between the upper portion 41a and the lower portion 41b, i.e., the height of the step 42 was also 0.03 micron. A pattern to be transferred was an isolated stripe, and the critical dimension was CD2.

Photo resist solution was spun onto the underlying layer 41, and was baked so as to form a photo resist layer 43. The revolution of the spin coater was regulated in such a manner that the photo resist layer 43 was 0.645 micron thick over the upper portion 41a and 0.675 micron thick over the lower portion 41b in accordance with the characteristic curve PL5.

The resultant structure was placed in the KrF excimer laser stepper, and the isolated pattern was transferred through KrF excimer laser light to the photo resist layer 43. The photo resist layer 43 was baked, again. The latent image was developed by using the 2.38% solution of tetramethylammoniumhydroxide for 60 seconds. After the rinse, the isolated pattern 44 was formed in the photo resist layer 43 as shown in FIG. 8B. Any serious deformation did not take place on both sides of the step 42.

EXAMPLE 3

An underlying layer 51 had a step 52 between an upper portion 51a and a lower portion 51b, and the distance between the upper portion 51a and the lower portion 51b, i.e., the height of the step 52 was also 0.03 micron. A dense pattern to be transferred was implemented by lines and spaces, and the critical dimension was CD1.

Photo resist solution was spun onto the underlying layer 51, and was baked so as to form a photo resist layer 53. The revolution of the spin coater was regulated in such a manner that the photo resist layer 53 was 0.695 micron thick over the upper portion 5a and 0.725 micron thick over the lower portion 51b in accordance with the characteristic curve PL5.

The resultant structure was placed in the KrF excimer laser stepper, and the pattern was transferred through KrF excimer laser light to the photo resist layer 53. The photo resist layer 53 was baked, again. The latent image was developed by using the 2.38% solution of tetramethylammoniumhydroxide for 60 seconds. After the rinse, the high dense pattern 54 was formed in the photo resist layer 53 as shown in FIG. 8C. Any serious deformation did not take place on both sides of the step 52.

EXAMPLE 4

An underlying layer 61 had a step 62 between an upper portion 61a and a lower portion 61b, and the distance between the upper portion 61a and the lower portion 61b, i.e., the height of the step 62 was also 0.03 micron. A dense pattern to be transferred was implemented by lines and spaces, and the critical dimension was CD2.

Photo resist solution was spun onto the underlying layer 61, and was baked so as to form a photo resist layer 63. The revolution of the spin coater was regulated in such a manner that the photo resist layer 63 was 0.645 micron thick over the upper portion 61a and 0.675 micron thick over the lower portion 61b in accordance with the characteristic curve PL5.

The resultant structure was placed in the KrF excimer laser stepper, and the pattern was transferred through KrF excimer laser light to the photo resist layer 63. The photo resist layer 63 was baked, again. The latent image was developed by using the 2.38% solution of tetramethylammoniumhydroxide for 60 seconds. After the rinse, the high dense pattern 64 was formed in the photo resist layer 63 as shown in FIG. 8D. Any serious deformation did not take place on both sides of the step 62.

As will be understood from FIGS. 8A to 8D, the present inventor confirmed that the process according to the present invention is effective against the deformation of pattern. The process is available for various steps different in height, and the accuracy is improved at 20 percent or more.

Although a particular embodiment of the present invention has been shown and described, it will be obvious to those skilled in the art that various changes and modifications may be made without departing from the spirit and scope of the present invention.

The thickness of a photo resist layer may be determined by using the steps of observing a cross section of a substrate covered with the photo resist layer by using an electron microscope so as to measure the thickness of the photo resist layer over the upper portion and the lower portion and determining the revolution of a spin coating in such a manner that the dimensions of a pattern is equal between that over the upper portion and the lower portion by using a characteristic curve PL3.

What is claimed is:

1. A process of patterning a photo resist layer, comprising the steps of:
   a) preparing an underlying layer having an upper portion and a lower portion on both sides of a step and a characteristic curve representative of relation between a critical dimension of a pattern formed in a sample photo resist layer and a thickness of said sample photo resist layer to be required for said critical dimension;
   b) determining a first target thickness of a thick portion of a photo resist layer extending over said lower portion and a second target thickness of a thin portion of said photo resist layer extending over said upper portion in such a manner that a difference between said first target thickness and a certain thickness at an extreme value of said critical dimension on said characteristic curve is approximately equal to a difference between said second target thickness and said certain thickness;
   c) covering said underlying layer with said photo resist layer having said thin portion and said thick portion; and
   d) forming said photo resist layer into a photo resist pattern having said critical dimension.

2. The process as set forth in claim 1, in which said characteristic curve is continuous, and has a plurality of peaks each providing said extreme value.

3. The process as set forth in claim 1, in which said pattern is an isolated pattern having said critical dimension.

4. The process as set forth in claim 1, in which said pattern is a dense pattern having said critical dimension.

5. The process as set forth in claim 4, in which said dense pattern is a line and space pattern.

6. The process as set forth in claim 1, in which said photo resist layer is spread over said underlying layer by using a spin coating technique.

7. The process as set forth in claim 1, in which said step d) includes the substeps of
   d-1) baking a layer of photo resist solution so as to form a photo resist layer,
   d-2) optically transferring said pattern from a photo mask to said photo resist layer formed in said step d-1) for forming a patent image of said pattern,
   d-3) baking said photo resist layer formed with said latent image,
   d-4) developing said latent image in said photo resist layer, and
   d-5) rinsing said photo resist layer so as to obtain said photo resist pattern.

* * * * *